US010712660B2

(12) United States Patent
Choi (10) Patent No.: US 10,712,660 B2
(45) Date of Patent: Jul. 14, 2020

(54) TEMPLATE FOR IMPRINT LITHOGRAPHY INCLUDING A RECESSION AND AN APPARATUS AND METHOD OF USING THE TEMPLATE

(71) Applicant: CANON KABUSHIKI KAISHA, Tokyo (JP)

(72) Inventor: Byung-Jin Choi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 142 days.

(21) Appl. No.: 15/387,384

(22) Filed: Dec. 21, 2016

(65) Prior Publication Data

US 2018/0170089 A1 Jun. 21, 2018

(51) Int. Cl.
*G03F 7/00* (2006.01)
*B29C 33/42* (2006.01)

(52) U.S. Cl.
CPC ...... *G03F 7/0002* (2013.01); *B29C 2033/422* (2013.01)

(58) Field of Classification Search
None
See application file for complete search history.

(56) References Cited

U.S. PATENT DOCUMENTS

| 6,873,087 | B1 | 3/2005 | Choi et al. |
| 7,157,036 | B2 | 1/2007 | Choi et al. |
| 8,076,386 | B2 | 12/2011 | Xu et al. |
| 10,274,822 | B2 * | 4/2019 | Mitra ............... B29C 33/38 |
| 2012/0138985 | A1 * | 6/2012 | Ono ............... H01L 21/0243 257/98 |
| 2015/0045250 | A1 * | 2/2015 | Kuroda ............ G01N 33/5306 506/9 |

OTHER PUBLICATIONS

Hang-Ting Lue, "Charge-Trapping (CT) Flash and 3D NAND Flash", 3rd Annual SEMATECH Symposium Taiwan, Sep. 3-9, 2010, slides 1 and 29.

* cited by examiner

*Primary Examiner* — Joshua D Zimmerman
(74) *Attorney, Agent, or Firm* — Abel Schillinger, LLP (57) ABSTRACT

A template for imprint lithography can include a body. The body can include a base surface and a recession extending from the base surface. The recession can have steps and a feature. The steps can include a distal step that is farther from the base surface as compared to any other step, each step having a corresponding height. The feature can include the distal step includes a rounded or tapered sidewall; a surface along a deepest part of the recession is non-planar; or the height corresponding to the distal step is different from an average height corresponding to remaining steps. The template can be used in an imprint lithography apparatus. The template can be used in manufacturing articles when patterning different layers at the same time. The template is well suited for forming 3D memory arrays.

18 Claims, 7 Drawing Sheets

TEMPLATE FOR IMPRINT LITHOGRAPHY INCLUDING A RECESSION AND AN APPARATUS AND METHOD OF USING THE TEMPLATE

FIELD OF THE DISCLOSURE

The present disclosure relates to imprint lithography, and more particularly to templates used for imprint lithography, wherein the templates have recessions, and apparatuses and methods of using the templates.

RELATED ART

Densities of electronic components are limited when the electronic components are laid out in a planar (two-dimensional or 2D) arrangement. Densities of electronic components can be further increased by orienting components in a vertical direction to allow for a three-dimensional or 3D arrangement. Memory devices have some of the highest electronic component densities of electronic devices. Many memory cells are arranged so that the memory cells density is as high as possible.

When the electronic components have a 3D arrangement, formation of the electronic device with such electronic components can involve many steps. In some 3D memory arrangements, a set of device layers may be formed and patterned individually or as a pair of conductive and insulating layers. For a 3D arrangement of a memory array having 32 word lines, 32 mask and etch operations may be used in forming the word lines. The complexity increases as the number of word lines increase. A need exists to simplify the process flow and still achieve good reproducibility required by large volume manufacturing.

SUMMARY OF THE INVENTION

In an aspect, a template can be used in an imprint lithography process. The template comprises a body including a base surface and a recession extending from the base surface, wherein the recession has:
  steps including a distal step that is farther from the base surface as compared to any other step, each step having a corresponding height; and
  a feature including:
    the distal step includes a rounded or tapered sidewall;
    a surface along a deepest part of the recession is non-planar; or
    the height corresponding to the distal step is different from an average height corresponding to remaining steps.

In an embodiment, the distal step includes a rounded or tapered sidewall.

In another embodiment, sidewalls for at least some of the steps include vertical sidewalls.

In a further embodiment, the surface along a deepest part of the recession is non-planar.

In still a further embodiment, the distal step has a height less than or greater than the average height corresponding to the remaining steps.

In yet another embodiment, the template further comprises an aperture, wherein the recession is in fluid communication with an area outside of the template via the aperture.

In another embodiment, heights corresponding to the at least some of the remaining steps are within 5% of one another.

In a further embodiment, other than the distal step, remaining steps include lateral portions having lateral distances that are at least 5 times the average height corresponding to the remaining steps.

In yet another embodiment, at least some of the remaining steps include lateral distances that are within 5% of one another.

In another aspect, an apparatus can be used in imprint lithography. The apparatus comprises a gas controller configured to be coupled to an aperture of a template.

In an embodiment, the gas controller comprises a pressure source selector configured to select between a vacuum source and a pressure source.

In a further embodiment, the gas controller comprises a pressure control mechanism configured to adjust a pressure within the aperture of the template.

In another embodiment, the apparatus further comprises:
  a substrate chuck to hold a substrate;
  a fluid dispense system to dispense the formable material onto the substrate; and
  a template chuck to hold the template.

In a further aspect, a method can be used to fabricate an article, wherein the method comprises:
  forming a formable material over a substrate;
  imprinting the formable material with a template that includes a body including a base surface and a recession extending from the base surface, wherein the recession has:
    steps including a distal step that is farther from the base surface as compared to any other step, each step having a corresponding height; and
    a feature including:
      the distal step includes a rounded or tapered sidewall;
      a surface along a deepest part of the recession is non-planar; or
      the height corresponding to the distal step is different from an average height corresponding to remaining steps; and
  curing the formable material to form a patterned resist layer over the substrate.

In an embodiment, the method further comprises:
  providing the substrate, wherein the substrate includes device layers; and
  patterning the device layers using the patterned resist layer, wherein after patterning, the device layers have steps.

In a particular embodiment, the template has a first number of steps, the device layers have a second number of steps, wherein the first number is larger than the second number.

In another particular embodiment, the device layers are gate electrodes of memory cells.

In another embodiment, the method further comprises:
  generating a vacuum within the recession during imprinting;
  increasing pressure when separating the template from the patterned resist layer; or both.

In another embodiment, a trapped void is formed within the recession during imprinting.

In a further embodiment, during curing, the formable material shrinks.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

As used herein, speed and motion may be described on a relative basis. For example, object A and object B move relative to each other. Such terminology is intended to cover object A is moving, and object B is not; object A is not moving, and object B is moving; and both of objects A and B are moving.

As used herein, the terms "comprises," "comprising," "includes," "including," "has," "having," or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

The use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the imprint, lithography, and semiconductor processing arts.

Figure 1:
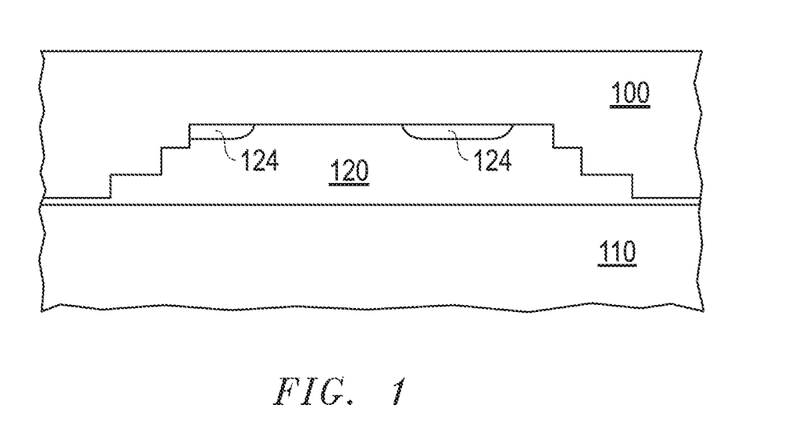
FIG. 1 includes an illustration of a cross-sectional view of a portion of a template, substrate and a formable material, wherein a trapped void is formed within the template.
Figure 2:
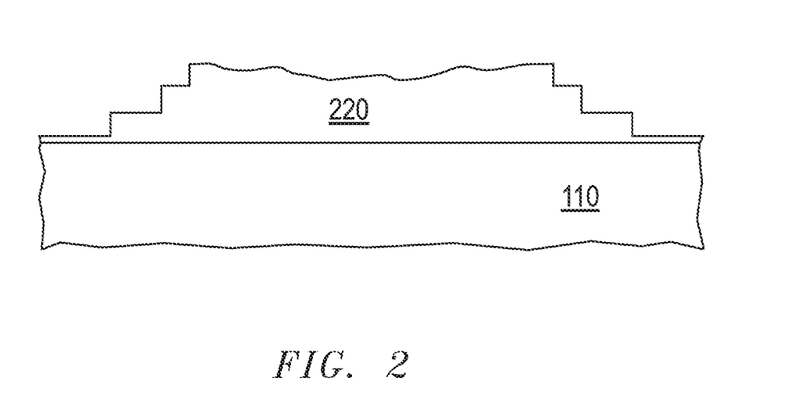
FIG. 2 includes an illustration of a cross-sectional view of a portion of a substrate and a patterned layer formed from a formable material, wherein the formable material shrank during curing.

Before addressing particular design details of the template, a couple of processing considerations are discussed with respect to FIGS. 1 and 2. The template in FIG. 1 has a recession in a stair-step configuration with three steps. In actual practice, the number of step may be much higher, such as 16, 32, 48, 64, 96, or more steps. The issues addressed below with respect to FIGS. 1 and 2 are significantly more challenging as the number of steps increase. FIG. 1 illustrates trapped voids, and FIG. 2 illustrates shrinkage of the formable material.

FIG. 1 includes a cross-sectional view of a template 100, a substrate 110, and a formable material 120 during an imprint operation. Due to the presence of large volume of gas within a recession 102 prior to filling of the recession 102 with the formable material 34, trapped voids 122 and 124 can be present even after a long filling period. In actual practice with many steps, typical dimensions of these multi-step features are several mm in the x-direction and y-direction while the height (in the z-direction) is a few microns. As a non-limiting example, each step can have a height of 10 nm to several hundred nanometers. If the height of a single step is 50 nm, for 96 steps, the total height will be 4.8 microns. As the number of steps increase, filling the recession with the formable material without a trapped void may be very difficult or even impossible.

FIG. 2 includes a cross-sectional view of a template 100, a substrate 110, and a patterned resist layer 220 after curing a formable material using the template 100. Even if the recession is fully filled with the formable material, the formable material can shrink and cause deformations at the top surface, a side surface, or both.

In FIGS. 1 and 2, the template 100 is designed to have the precise shape of a patterned resist layer to be formed when patterning different device layers with different lateral dimensions. However, the patterned resist layer is locally thinner at locations below the trapped voids 122 or where shrinkage has occurred. Accordingly, a sufficient thickness of the patterned resist layer is not present. More particularly, when patterning the device layers to their final lateral dimensions, one or more of the upper device layers may be thinned or completely etched through at locations where such one or more upper devices layers are to be continuous and have a substantially uniform thickness.

A template for imprint lithography can have a design so that a more robust manufacturing process can be used, even if a trapped void is formed or if the formable material shrinks due to curing. The template is useful for 3D arrangements of electronic components and is well suited for 3D memory arrays. The template may include a feature such as an extra step that does not correspond to a step in the device layers, the distal step (farthest from a base surface of the template) has a height that is different from another step (for example, the distal step has a greater height than the other step), a surface along a deepest part of the recession is non-planar, or the distal step includes a rounded or tapered sidewall.

Details regarding the templates and apparatuses and methods using the templates are better understood after reading this specification in conjunction with figures. The description below is meant to illustrate embodiments and not limit the scope of the present invention, which is defined in the appended claims.

Figure 3:
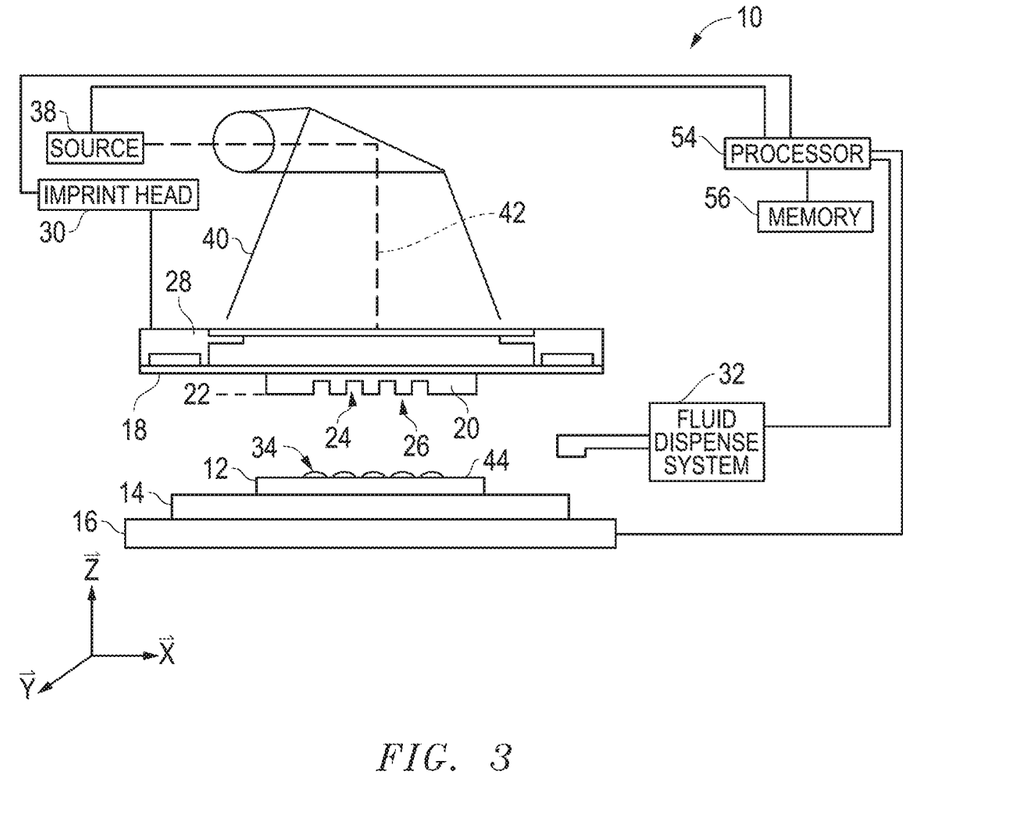
FIG. 3 includes a simplified side view of an exemplary imprint lithography system.

Referring to the figures, and particularly to FIG. 3, an imprint lithographic system 10 in accordance with embodiments described herein can be used to form a relief pattern on a substrate 12. The substrate 12 may be coupled to a substrate chuck 14. As illustrated, the substrate chuck 14 is a vacuum chuck; however, in other embodiments the substrate chuck 14 may be any chuck including vacuum, pin-type, groove-type, electrostatic, electromagnetic, or the like. Exemplary chucks are described in U.S. Pat. No. 6,873,087, which is hereby incorporated by reference in its entirety herein.

Substrate 12 and substrate chuck 14 may be further supported by a stage 16. The stage 16 may provide translational or rotational motion along the X-, Y-, or Z-directions. The stage 16, substrate 12, and substrate chuck 14 may also be positioned on a base (not illustrated).

Spaced-apart from the substrate 12 is a template 18. The template 18 can include a body having a first side and a second side with one side having a mesa 20 extending therefrom towards the substrate 12. The mesa 20 is sometimes referred to as a mold 20. In an embodiment, the template 18 can be formed without a mesa 20.

The template 18 or mold 20 may be formed from such materials including fused-silica, quartz, silicon, organic polymers, siloxane polymers, borosilicate glass, fluorocarbon polymers, metal, hardened sapphire, other similar materials, or any combination thereof. The template 18 and mold 20 can include a single piece construction. Alternatively, the template 18 and mold 20 can include separate components coupled together. As illustrated, a patterning surface 22 includes features defined by spaced-apart recesses 24 and protrusions 26. The disclosure is not intended to be limited to such configurations (e.g., planar surfaces). Patterning surface 22 may define any original pattern that forms the basis of a pattern to be formed on the substrate 12.

The template 18 can be coupled to a chuck 28. The chuck 28 can be configured as vacuum, pin-type, groove-type, electrostatic, electromagnetic, or another similar chuck type. Exemplary chucks are further described in U.S. Pat. No. 6,873,087. In an embodiment, the chuck 28 may be coupled to an imprint head 30 such that the chuck 28 or imprint head 30 can facilitate movement of the template 18.

The lithographic system 10 can further include a fluid dispense system 32 used to deposit a formable material 34 on the substrate 12. For example, the formable material can include a polymerizable material, such as a resin. The formable material 34 can be positioned on the substrate 12 in one or more layers using techniques such as droplet dispense, spin-coating, dip coating, chemical vapor deposition (CVD), physical vapor deposition (PVD), thin film deposition, thick film deposition, or combinations thereof. The formable material 34 can be dispensed upon the substrate 12 before or after a desired volume is dispensed between the mold 22 and the substrate 12 depending on design considerations. For example, the formable material 34 can include a monomer mixture as described in U.S. Pat. Nos. 7,157,036 and 8,076,386, both of which are herein incorporated by reference in their entireties.

The lithographic system 10 can further include an energy source 38 coupled to a direct energy 40 along a path 42. The imprint head 30 and stage 16 can be configured to position the template 18 and substrate 12 in superimposition with the path 42. The lithographic system 10 can be regulated by a logic element 54 in communication with the stage 16, imprint head 30, fluid dispense system 32, or source 38, and may operate on a computer readable program, optionally stored in memory 56.

In an embodiment, either the imprint head 30, the stage 16, or both the imprint head 30 and the stage 16 vary a distance between the mold 20 and the substrate 12 to achieve a desired volume therebetween that is filled by the formable material 34. For example, the imprint head 30 can apply a force to the template 18 such that the mold 20 contacts the formable material 34 on the substrate 12. After the desired volume is filled with the formable material 34, the source 38 can produce energy 40, e.g., ultraviolet radiation, causing the formable material 34 to solidify or cross-link conforming to a shape of the surface 44 of the substrate 12 and patterning surface 22 defining a patterned layer on the substrate 12. In this specification, attention is directed to the design of s the template and recessions having a stair-step configuration.

More details of the template and forming an article are provided. In a particular embodiment, the article can be an electronic device fabricated on a wafer, wherein the electronic device includes a 3D NAND non-volatile memory. After reading this specification, skilled artisans will appreciate that the concepts described herein can be used for other electronic devices that may or may not be memory devices. The concepts are well suited for electronic components that are connected serially or in parallel in a 3D arrangement.

Figure 4:
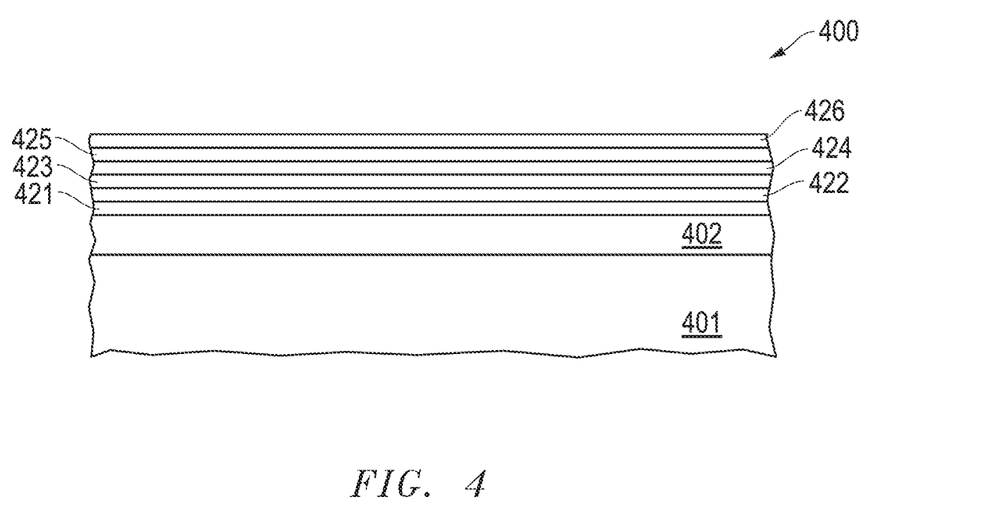
FIG. 4 includes an illustration of a cross-sectional view of a portion of a substrate including a base material, a doped region, and device layers.

FIG. 4 includes a cross-sectional view of a portion of a substrate 400 within a memory array. Although not illustrated, another part of the substrate 400 outside the memory array can include electronic components that may be part of a circuit, such as a row or column decoder, a row or column array strobe, a sense amplifier, or the like. The circuit may be formed before or after the memory cells. The substrate 400 includes a base material 401, such as a semiconductor wafer, a doped region 402, and device layers 421 to 426 overlying the doped region 402. In a NAND non-volatile memory, the doped region 402 can be source region that is shared between different memory cells that are spaced apart laterally (in the x-direction, y-direction, or both) from the memory cells being formed in FIG. 4. In the embodiment illustrated, the device layers 422, 424, and 426 are conductive and will be word lines for the memory cells, and the device layers 421, 423, and 425 are insulators and electrically insulate the device layers 422, 424, and 426 from one another and the doped region 402. The device layers 422, 424, and 426 can include a doped semiconductor material, a metal-containing material (for example, a metal, a metal alloy, a metal silicide, or the like), or another material suitable for a gate electrode. The device layers 421, 423, and 425 include an oxide, a nitride, an oxynitride, or the like.

Figure 5:
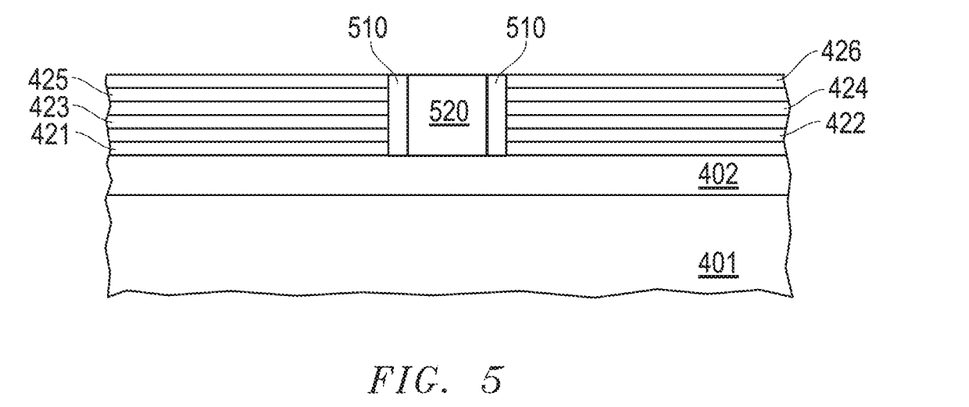
FIG. 5 includes an illustration of a cross-sectional view of the substrate of FIG. 4 after patterning the device layers and forming an insulating layer and a channel core.

The device layers 421 to 426 are patterned to define an opening. Insulating layer 510 and a channel core 520 are formed within the opening, as illustrated in FIG. 5. The insulating layer 520 can include an oxide film, a nitride film, and another oxide film. In a NAND non-volatile memory cell, charge carriers, such as electrons, can be stored or removed from charge traps within the nitride film. Thus, the insulating layer 510 can include the nitride film is disposed between the oxide films. After deposition, portions of the insulating layer 510 overlying the device layer 426 and bottom of the opening can be removed to achieve a sidewall spacer. In a particular embodiment, the sidewall spacer shape, as illustrated in FIG. 4, is achieved by conformally depositing the films and anisotropically etching the films.

The channel core 520 can include a semiconductor material that will include the channel regions of the memory cells being formed. The channel core 520 can include a semiconductor layer and a dopant having a concentration to achieve a desired threshold voltage for the memory cells. The channel core 520 can be epitaxially grown from the doped region 402 or a semiconductor material may be deposited as an amorphous material and crystalized from the doped region 402. In another embodiment, the channel core 520 can be deposited as a polycrystalline material. If any semiconductor material is deposited over the device layer 426 when forming the channel core 502, it can be removed before continuing with patterning of the device layers 421 to 426. Although not illustrated, many other openings with sidewall spacers, including the insulating layer 510, and channel cores 520 are formed.

A template can be selected for patterning the device layers 421 to 426 and achieve a stair-step configuration of the device layers 421 to 426, where pairs of device layers form each step. More particularly, the device layers 421 and 422 form one step, the device layers 423 and 424 form another step, and the device layers 425 and 426 form yet another step. As previously discussed, the design of the template allows for the possibility of a trapped void or shrinkage of the formable material when forming a patterned resist layer used to pattern the device layers 421 to 426.

Figure 6:
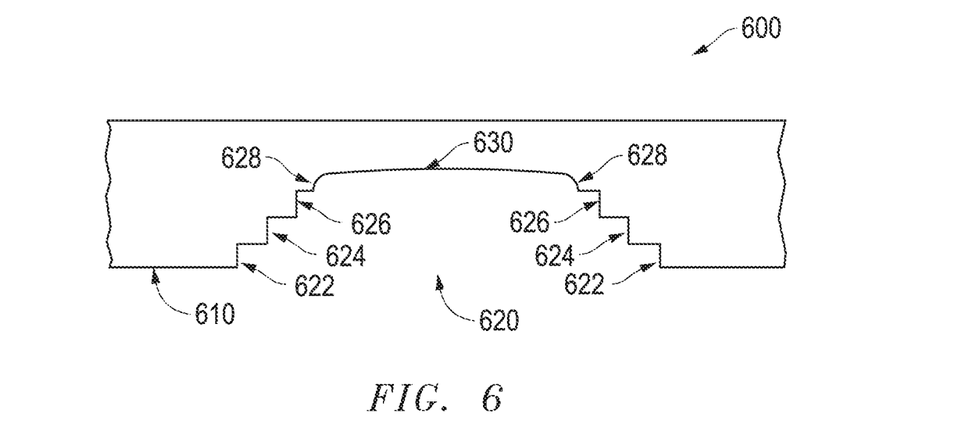
FIG. 6 includes an illustration of a cross-sectional view of a portion of a template for imprint lithography in accordance with an embodiment.

FIG. 6 includes a template 600 in accordance with an embodiment. The template 600 has a base surface 610 that lies along a base plane. The template 600 has a recession 620 and includes device steps 622, 624, and 626, which will be used to pattern the device layers 421 to 426, and an extra step 628. The extra step 628 is the distal step (farthest from the base surface 610) and allows formable material to completely fill the devices steps 622, 624, and 626. If there is a trapped void, it can be contained within the extra step 628. If formable material shrinks, the extra step 628 can compensate for the shrinkage, so that the patterned resist layer along the steps 626 and 628 will have a thickness that is at least as thick as the height of the device step 626.

Each step has a rise corresponding to the height and a run corresponding to the lateral dimension. The device step 622 has a height corresponding to the combined thickness of the device layers 421 and 422, the device step 624 has a height corresponding to the combined thickness of the device layers 423 and 424, and the device step 626 has a height corresponding to the combined thickness of the device layers 425 and 426. In a particular embodiment, the heights of the device steps 622, 624, and 626 are the same. However, the heights of the device steps 622, 624, and 626 may not be the same. In an embodiment, the heights of the device steps 622, 624, and 626 are within 5% of one another. When the height difference between the devices steps 622, 624, and 626 are due to the limits of manufacturing variation and reproducibility, the heights of the device steps 622, 624, and 626 may within 1% of one another.

With respect to the device steps 622, 624, and 626, the runs correspond to portions of the conductive device layers 422, 424, and 426 where electrical contacts will be made to the device layers 422, 424, and 426. Thus, the runs have a lateral dimension sufficient for the electrical contacts and their corresponding misalignment tolerances, if any. For the device steps 622, 624, and 626, the lateral dimensions of the runs can be in a range of 1.1 to 10 times greater than the heights of the corresponding steps. In a particular embodiment, the lateral dimensions of the device steps 622, 624, and 626 are the same. However, the lateral dimensions of the device steps 622, 624, and 626 may not be the same. In an embodiment, the lateral dimensions of the device steps 622, 624, and 626 are within 5% of one another. When the lateral dimensions difference between the devices steps 622, 624, and 626 are due to the limits of manufacturing variation and reproducibility, the lateral dimensions of the device steps 622, 624, and 626 may within 1% of one another.

The extra step 628 has a height that can be the same or different from any of the device steps 622, 624, and 626. In an embodiment, the extra step 628 has a height less than any of the device steps 622, 624, and 626, and in another embodiment, the extra step 628 has a height greater than any of the device steps 622, 624, and 626. The extra step 628 can have a height that is different from the average height of the device steps 622, 624, and 626 and. in a particular embodiment, is more than 5% different from the average height.

The rise of the device steps 622, 624, and 626 may be vertical (with respect to the base plane 610) or may be oriented with a slight angle (for example, no more than 10° from vertical) to help guide any trapped air during imprinting towards the extra step 628. The sidewall of the extra step 628 may be vertical, tapered, or rounded. If tapered, the tapered sidewall may be at the slight angle or a greater angle (at least 10° from vertical). As illustrated in the embodiment of FIG. 6, the surface 630 along the deepest part of the recession 620 is planar. In another embodiment, the surface can be non-planar.

Figure 7:
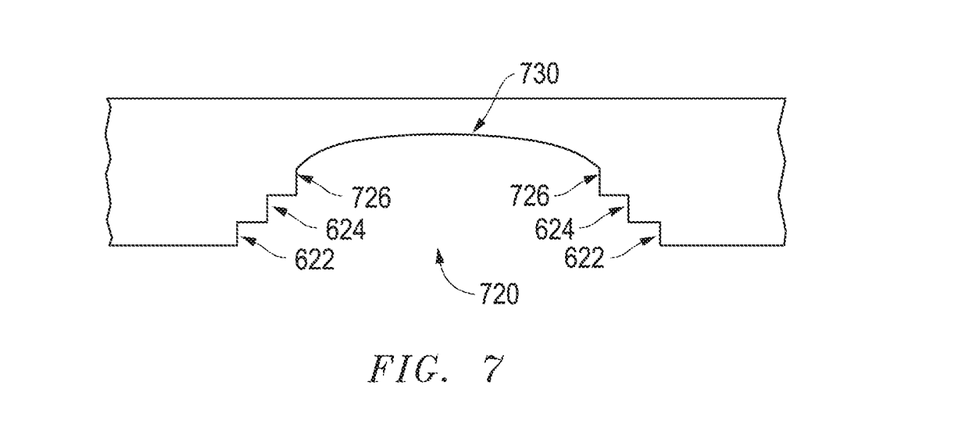
FIG. 7 includes an illustration of a cross-sectional view of a portion of a template for imprint lithography in accordance with another embodiment.

FIG. 7 includes a template 700 in accordance with another embodiment. The template 700 has the base surface 610 and a recession 720 that includes device steps 622, 624, and 726, which will be used to pattern the device layers 421 to 426. The device steps 622 and 624 have the characteristics as previously described with respect to the template 600 in FIG. 6. Instead of an extra step, the distal device step 726 (farthest from the base surface 610) has a height greater than the heights of each of the device steps 622 and 624. The deeper device step 726 allows formable material to completely fill the devices steps 622 and 624 and provides sufficient capacity to account for a trapped void, material shrinkage, or both. If there is a trapped void, it can be contained within the deeper device step 726. If there is shrinkage, the deeper device step 726 can compensate for the shrinkage, so that the patterned resist layer along the step 726 will have a sufficient thickness.

Each step has a rise corresponding to the height and a run corresponding to the lateral dimension. The deeper device step 726 has a height greater than the combined thickness of the device layers 425 and 426. In an embodiment, the deeper device step 726 can have a height that is at least 5% greater than the average height of the device steps 622 and 624.

The sidewall of the deeper device step 726 may be vertical or have a slight angle near the device step 624 and be tapered or rounded near the surface 730 along the deepest part of the recession 720. If tapered, the tapered sidewall may be a slight angle (for example, no more than 10° from vertical) or a greater angle (at least 10° from vertical). As illustrated in the embodiment of FIG. 7, the surface 730 is non-planar. In another embodiment (not illustrated), the surface 730 can be planar.

Figure 8:
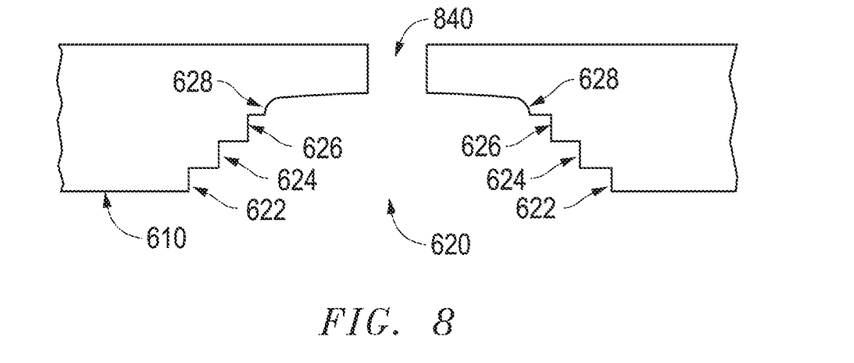
FIG. 8 includes an illustration of a cross-sectional view of a portion of a template for imprint lithography in accordance with a further embodiment.
Figure 9:
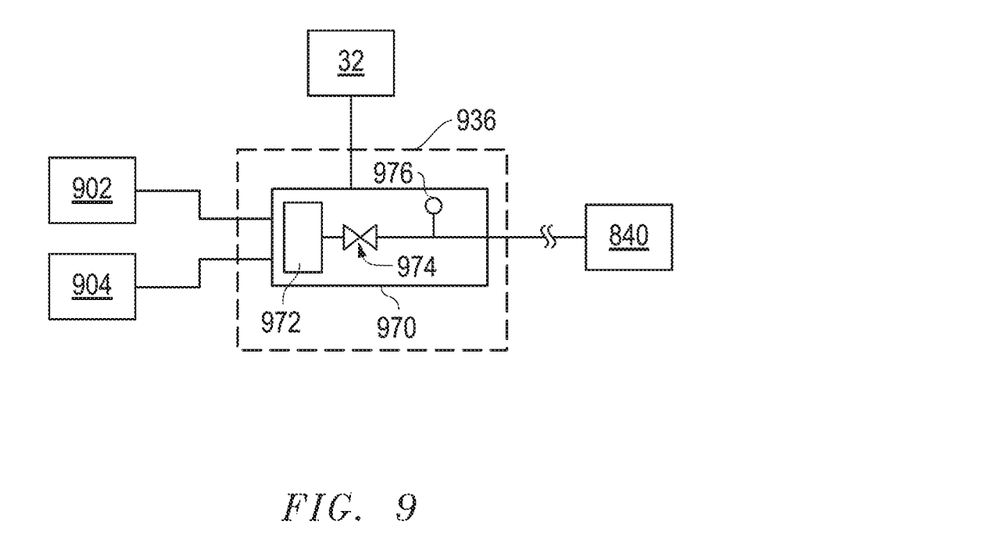
FIG. 9 includes a depiction of a gas flow controller in relationship to pressure sources, an aperture of the template of FIG. 8, and a processor.

FIG. 8 includes a template 800 in accordance with another embodiment. The template 800 is similar to the template 600 except the template 800 has an aperture 840 extending from the recession 620 to allow the recession 620 to be in fluid communication with an area outside of the template 800. FIG. 9 includes a depiction of a gas flow controller in relationship to pressure sources, the template 800, and a processor. In particular, the recession 620 is in fluid communication with the gas controller 936 via the aperture 840. The gas controller 936 is in fluid communication with a vacuum (negative pressure) source 902 and a (positive) pressure source 904. Although not illustrated, the gas controller 936 can allow the recession 620 to be at ambient pressure, too. The gas controller 936 includes a control unit 970 that include a pressure source selector 972, a valve or other pressure control mechanism 974, and a pressure sensor 976. The gas controller 936 is coupled to the processor 54 (FIG. 3). Logic for operating the gas controller 936 may be within gas controller 936, the processor 54, or both. In a particular embodiment, the recession 620 may be set to a vacuum set point or a pressure set point. The pressure source selector 972 can select the desired source 902 or 904, and the valve 974 can be adjusted so that the pressure, as sensed by the pressure sensor 976, is the same as or within a predetermined tolerance of the set point.

During an imprinting operation, a vacuum may help to guide air from the device steps 622, 624, and 626 of the template. In another embodiment, the side of the template 800 opposite the recession may be at ambient pressure during imprinting to allow trapped air to more easily leave the recession 820 as compared to the recession 620 of the template 600 that does not have an aperture. After curing the formable material to form the patterned resist layer, pressure may be applied via the pressure source 904 to aid in separating the template 800 from the patterned resist layer formed from the formable material.

In a further embodiment, the template 700 can be modified to have an aperture similar to the aperture 840 of template 800 extending from the deeper device step 726. In still another embodiment, another template may be similar to the template 800 but not have the extra step 628, and in such a template, any excess of the formable material may enter the aperture. After reading this specification, skilled artisans will appreciate that other template designs can be used to meet the needs or desires for a particular application without deviating from the scope of the present invention as defined in the appended claims.

Figure 10:
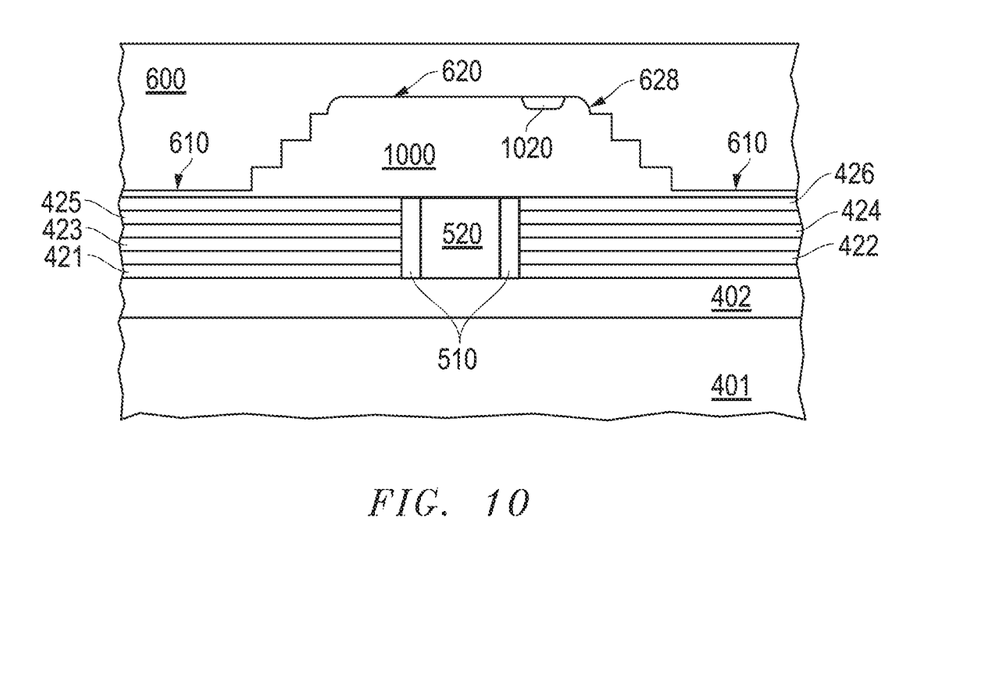
FIG. 10 includes an illustration of a cross-sectional view of the substrate of FIG. 5 and the template of FIG. 6 during imprinting a formable material.

The method of fabricating the article continues and will be processed using the template 600 in FIG. 6. Referring to FIGS. 3, 5, and 6, the substrate as illustrated in FIG. 5 is placed on and held in position by the substrate chuck of 14. The fluid dispense system 32 and substrate are positioned relative to each other. The processor 54 sends an instruction to the fluid dispense system 32 that dispenses or otherwise forms the formable material over the device layer 426, the insulating layer 510, and the channel core 520 at proper areal densities to fill recessions within the mold. In the particular embodiment, the template 600 with the recession 620 in FIG. 6 is used to imprint the formable material 1000. The substrate and template are moved closer to each other, and the template contacts the formable material. Referring to FIG. 10, the movement continues, and the formable material 1000 fills the recession 620 and other recessions (not illustrated) in the template 600. As the recession 620 fills, some air becomes trapped within the recession 620 to form a trapped void 1020 that is within the extra step 628 of the recession 620. The formable material 1000 within the extra step 628 represents the additional thickness of the formable material 1000 to account for the trapped voids 1020, subsequent material shrinkage or other complication that could otherwise adversely affect the properly patterning of the device layers 421 to 426.

Figure 11:
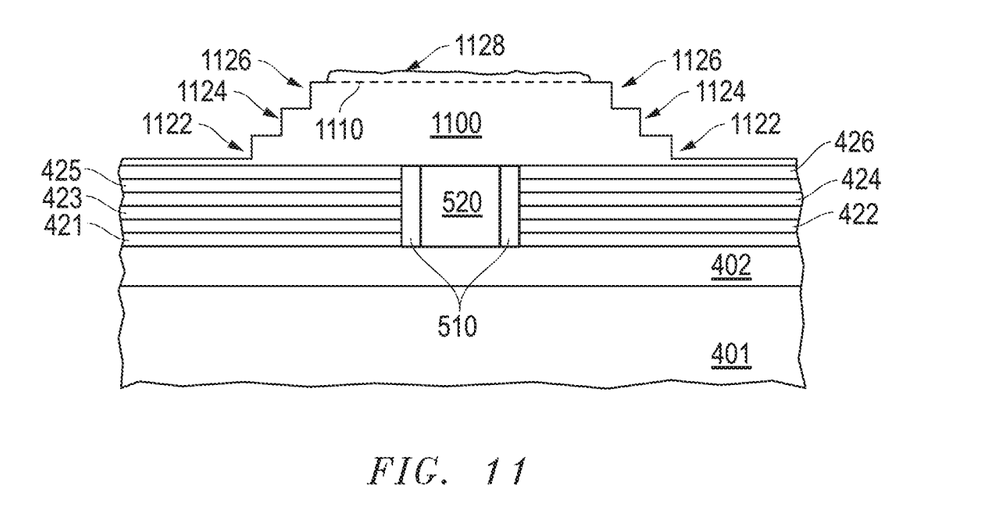
FIG. 11 includes an illustration of a cross-sectional view of the substrate of FIG. 10 after forming a patterned resist layer from the formable material and removing the template.

The method can include curing the formable material 1000 to form a patterned resist layer 1100 in FIG. 11 corresponding to the pattern surface of the template 600. Curing can be performed by exposure to electromagnetic radiation. In an embodiment, the electromagnetic radiation can be ultraviolet radiation. In another embodiment, the formable material can be cured using heat. Portions of the patterned resist layer 1100 that were formed between the substrate and the base surface 610 of the template 600 form the residual layer. After curing, the template 600 is separated from the patterned resist layer 1100 having device steps 1122, 1124, and 1126 as illustrated in FIG. 11. In addition to the trapped void, the formable material shrank during curing; however, even with the trapped voids and shrinkage, all of the patterned resist layer 1100 within the central part 1128 has a thickness that is at or above the dashed line 1110. Thus, the central part 1128 has a sufficient thickness to allow the proper patterning of the device layers 422, 424, and 426. The non-planar surface for the central part 1128 will not cause a problem during patterning.

The patterned resist layer 1100 can be used to pattern the underlying device layers 421 to 426. During a first portion of the patterning sequence, the residual layer can be ashed using an $O_2$ plasma. The ashing can be performed as a timed etch, endpoint detection, or endpoint detection and a timed overetch.

Portions of the device layer 426 that were covered by the residual layer are exposed after the ashing. The device layer 426 and the device layer 425 can be patterned for a first time. The etching gas used for the device layer 426 has good selectivity to the materials in the patterned resist layer 1100 and the device layer 425, and the etching gas used for the device layer 425 has good selectivity to the materials in the patterned resist layer 1100 and the device layer 424 that underlies the device layer 425. When the device layer 426 includes polycrystalline or amorphous silicon, the etch chemistry can include HBr with or without $O_2$. When the device layer 425 includes a silicon oxide, the etch chemistry can include $CHF_3$. Other etch chemistries may be used and provide sufficient selectivity with respect to other layers. The etching can be performed anisotropically using reactive ion etching.

Figure 12:
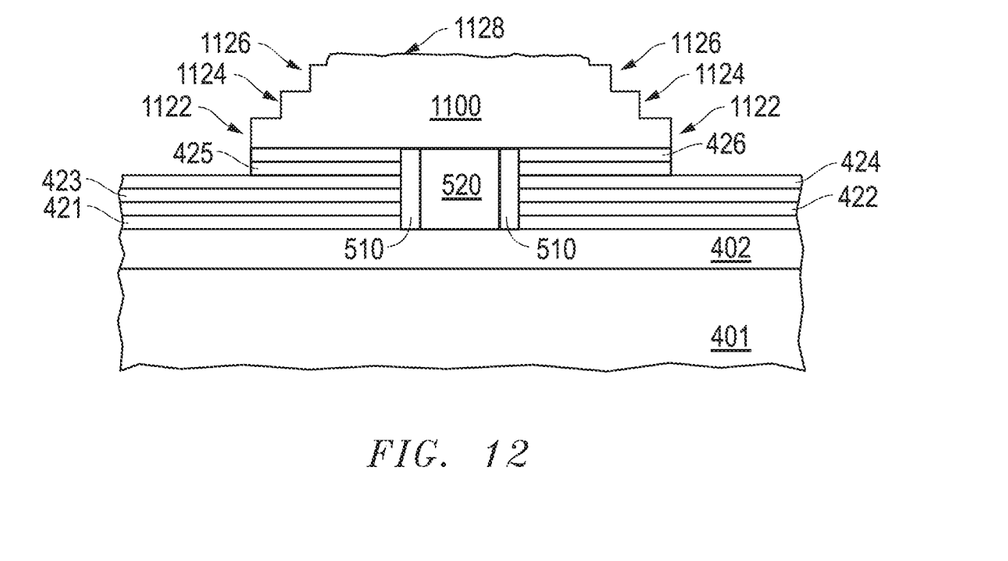
FIG. 12 includes an illustration of a cross-sectional view of the substrate of FIG. 11 after removing a residual layer of a patterned resist layer and patterning an uppermost pair of device layers.

The device layers 426 and 425 are serially etched and have a shape corresponding to the step 1122 of the patterned resist layer 1100. Similar to ashing of the residual layer, the etching of each of the device layers 426 and 425 can be performed as a timed etch, endpoint detection, or endpoint detection with a timed overetch. After the device layer 425 is etched, portions of the device layer 424 are exposed, as illustrated in FIG. 12.

Figure 13:
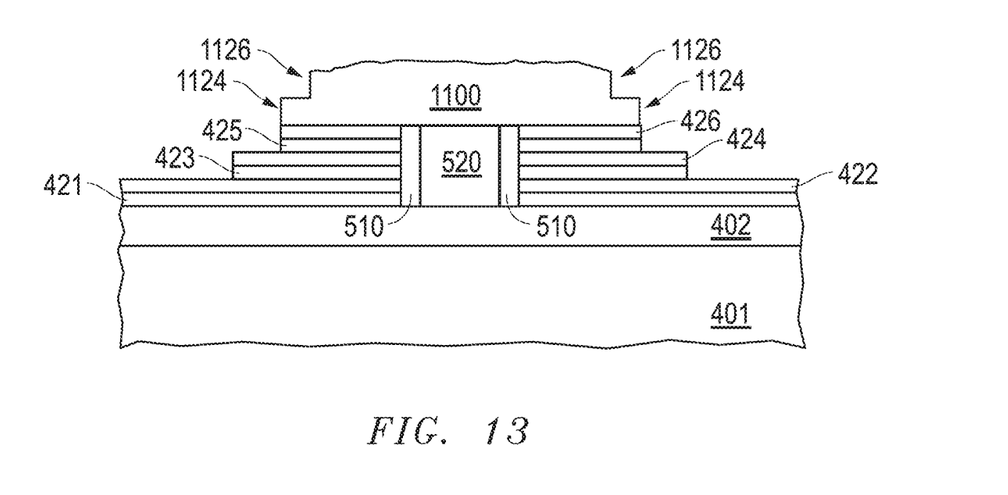
FIG. 13 includes an illustration of a cross-sectional view of the substrate of FIG. 12 after patterning the upper two pairs of device layers.

Ashing can be performed to remove part of the pattered resist layer 1100. The patterned resist layer 1100 is thinned, and the step 1122 is removed. As the step 1122 is removed, a signal based on carbon (e.g., $CO_2$, CO, or the like) will have a step function decrease as the step 1122 is removed. Thus, endpoint detection can be used, if desired. The ashing can be performed as a timed etch, endpoint detection or a combination of endpoint detection and a timed overetch. The device layers 424 and 423 can be sequentially patterned to expose the device layer 422, as illustrated in FIG. 13. The device layers 425 and 426 can be patterned with the device layers 423 and 424, respectively. The etch chemistries and etch technique can be any of those previously described with respect to the device layers 426 and 425.

Figure 14:
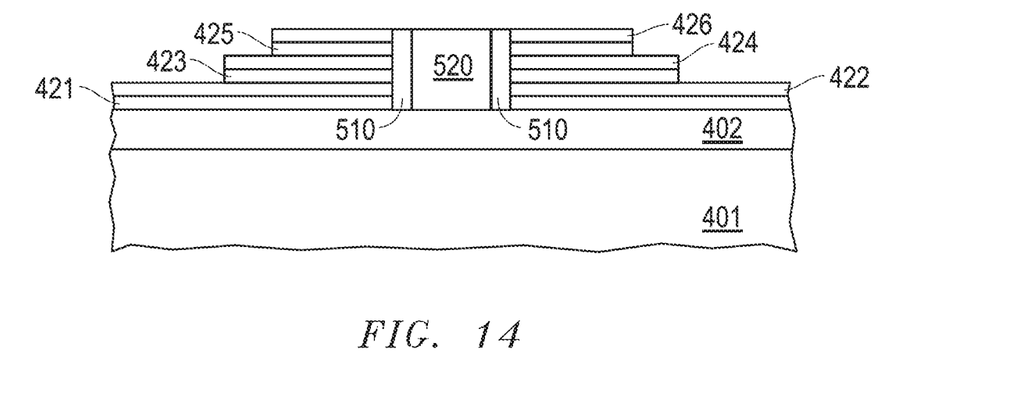
FIG. 14 includes an illustration of a cross-sectional view of the substrate of FIG. 13 after patterning the device layers.

Ashing can be performed to remove part of the pattered resist layer 1100. The patterned resist layer 1100 is thinned, and the step 1124 is removed. As the step 1124 is removed, a signal based on carbon (e.g., $CO_2$, CO, or the like) will have a step function decrease as the step 1124 is removed. Thus, endpoint detection can be used, if desired. The ashing can be performed as a timed etch, endpoint detection or a combination of endpoint detection and a timed overetch. The device layers 422 and 421 can be sequentially patterned to expose the doped region 402. The etch chemistries and etch technique can be any of those previously described with respect to the device layers 426 and 425. Exposed portions of the device layers 422, 424, and 426 can be patterned during the same etch, and after etching exposed portions of the device layers 422, 424, and 426, exposed portions of the device layers 421, 423, and 425 can be patterned during the same etch. The process of patterning the device layers 421 to 426 is simplified when the conductive device layers 422, 424, and 426 have the same composition and substantially the same thickness, and conductive device layers 421, 423, and 425 have the same composition and substantially the same thickness. As used herein "substantially the same thickness" means that the thicknesses are within 10% of each other. The remaining portion of the patterned resist layer 1100 is ashed. FIG. 14 includes the substrate and patterned device layers.

Figure 15:
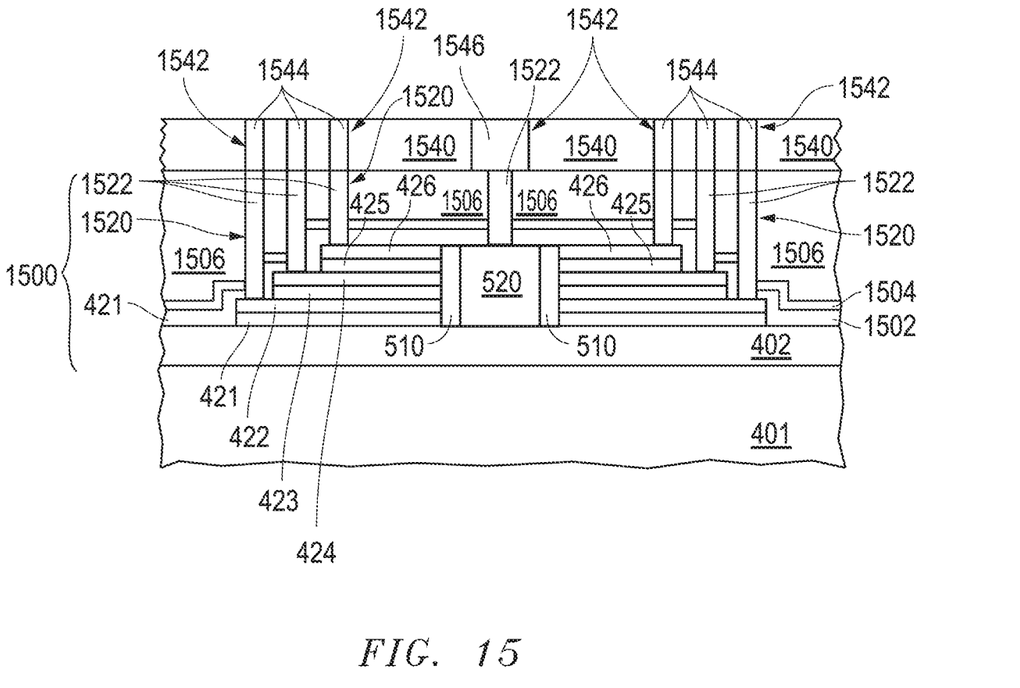
FIG. 15 includes an illustration of a cross-sectional view of the substrate of FIG. 14 after forming a substantially completed article.

Further processing is performed to form a substantially completed article, as illustrated in FIG. 15. An interlevel dielectric (ILD) layer 1500 is formed over the substrate, including the patterned device layers 421 to 426. In an embodiment, the ILD layer 1500 may include a plurality of films. For example, the ILD layer 1500 can include an undoped oxide film 1502, an etch-stop film 1504, and a doped oxide film 1506. The layers can be sequentially deposited and polished. As can be seen in FIG. 15, the thickness of the doped oxide film 1506 has a thickness that significantly differs between locations. The etch-stop film 1504 helps in providing a more controlled etch of the doped oxide film 1506 for contacts to the conductive device layers 422, 424, and 426 and to other parts of the article. The etch-stop film 1504 can include a nitride layer. The etch can be performed using endpoint detection or a combination of endpoint detection and a timed over etch. As compared to the doped oxide film 1506, the films 1502 and 1504 are relatively thinner and have more uniform thicknesses, and thus, they are sequentially etched without any significant complication. The patterned ILD layer 1500 has contact openings 1520. In another embodiment, more or fewer films can be used in the patterned ILD layer 1500, the compositions of the films 1502, 1504, and 1506 may be different from those previously described. After reading this specification, skilled artisans will appreciate that the number of films and their compositions of the ILD 1500 can be tailored for the needs or desires for a particular application.

Conductive plugs 1522 can be formed within the contact openings 1520. An insulating layer 1540 can be formed and patterned to form interconnect trenches 1542, and interconnects 1544 and 1546 can be formed within the interconnect trenches. The interconnects 1544 are electrically connected to the device layers 422, 424, and 426 via the conductive plugs 1522. The interconnects 1544 provide signals to the word lines of the memory array in the embodiment illustrated in FIG. 15. The interconnect 1546 is electrically connected to the channel core 520. Thus, the interconnect 1546 is part of a bit line for the memory array.

In another embodiment, a memory array includes more device layers and more channel cores coupled to the device layers. The channel cores may be arranged in a staggered arrangement along adjacent rows to allow for a more densely packed memory array. In a further embodiment, the order of patterning the device layers 421 to 426 with respect to the channel core 520 and forming landing regions for conductive plugs 1522 can be reversed. The device layers 421 to 426 may be patterned to achieve the stair-step configuration before patterning the device layers 421 to 426 for the insulating layer 510 and channel core 520.

Other types of electronic components may be formed using the techniques as described herein. In particular, functions of the device layers 422, 424, and 426 and channel core 520 may be changed. For example, the device layers 422, 424, and 426 can be in the form of channel regions of transistors, and the channel core 520 may be replaced by a gate electrode. In a particular example, the transistors may be depletion-mode transistors, and the gate electrode may be a common gate electrode for the transistors. Such a configuration may be useful when channel regions of transistors correspond to the device layers 422, 424, and 426, which may be electrically connected to different components, are to be turned on or turned off together. Such a configuration may be useful when a signal (on the common gate electrode) is used by different circuits simultaneously.

The templates as described herein are useful for patterning many device or other layers of an article using the same patterned resist layer formed using imprint lithography. The template can be designed so that trapped voids, material shrinkage of a formable material, another processing consequence affecting thickness of a patterned resist layer, or any combination thereof does not resulting patterning of an upper device layer at an unintended location. Accordingly, the template allows for a more robust patterning sequence used in manufacturing when patterning several device layers using as little as a single patterned resist layer. The templates are useful in the formation of 3D memory arrays and other electronic components.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A template for imprint lithography comprising:
a body including a base surface and a recession extending from the base surface, wherein the recession has:
steps including a distal step that is farther from the base surface as compared to any other step, each step having a corresponding step height; and
a feature including:
the step height corresponding to the distal step is higher than an average step height corresponding to remaining steps, wherein the step height is defined as a distance between a top of that step and a top of the adjacent step.

2. The template of claim 1, wherein the distal step includes a rounded or tapered sidewall.

3. The template of claim 1, wherein sidewalls for at least some of the steps include vertical sidewalls.

4. The template of claim 1, wherein the surface along a deepest part of the recession is non-planar.

5. The template of claim 1, wherein the distal step has a height less than or greater than the average height corresponding to the remaining steps.

6. The template of claim 1, further comprising an aperture, wherein the recession is in fluid communication with an area outside of the template via the aperture.

7. The template of claim 1, wherein heights corresponding to at least some of the remaining steps are within 5% of one another.

8. The template of claim 1, wherein other than the distal step, remaining steps include lateral portions having lateral distances that are at least 5 times the average height corresponding to the remaining steps.

9. The template of claim 1, wherein at least some of the remaining steps include lateral distances that are within 5% of one another.

10. The apparatus of claim 1, wherein the distal step includes a rounded or tapered sidewall.

11. The apparatus of claim 1, wherein the feature further includes a surface along a deepest part of the recession and the surface is non planar.

12. A method of fabricating an article comprising:
forming a formable material over a substrate;
imprinting the formable material with a template that includes:
a body including a base surface and a recession extending from the base surface, wherein the recession has:
steps including a distal step that is farther from the base surface as compared to any other step, each step having a corresponding height; and
a feature including:
the height corresponding to the distal step is higher than an average height corresponding to remaining steps, wherein the step height is defined as a distance between a top of that step and a top of the adjacent step; and
curing the formable material to form a patterned resist layer over the substrate.

13. The method of claim 12, further comprising:
providing the substrate, wherein the substrate includes device layers; and
patterning the device layers using the patterned resist layer, wherein after patterning, the device layers have steps.

14. The method of claim 13, wherein the template has a first number of steps, the device layers have a second number of steps, wherein the first number is larger than the second number.

15. The method of claim 13, wherein the device layers are gate electrodes of memory cells.

16. The method of claim 12, further comprising:
generating a vacuum within the recession during imprinting;
increasing pressure when separating the template from the patterned resist layer; or
both.

17. The method of claim 12, wherein a trapped void is formed within the recession during imprinting.

18. The method of claim 12, wherein, during curing, the formable material shrinks.

* * * * *

UNITED STATES PATENT AND TRADEMARK OFFICE
CERTIFICATE OF CORRECTION

PATENT NO. : 10,712,660 B2  
APPLICATION NO. : 15/387384  
DATED : July 14, 2020  
INVENTOR(S) : Byung-Jin Choi Page 1 of 1

It is certified that error appears in the above-identified patent and that said Letters Patent is hereby corrected as shown below:

On the Title Page

Item (57) ABSTRACT, please replace:
"A template for imprint lithography can include a body. The body can include a base surface and a recession extending from the base surface. The recession can have steps and a feature. The steps can include a distal step that is farther from the base surface as compared to any other step, each step having a corresponding height. The feature can include the distal step includes a rounded or tapered sidewall; a surface along a deepest part of the recession is non-planar; or the height corresponding to the distal step is different from an average height corresponding to remaining steps. The template can be used in an imprint lithography apparatus. The template can be used in manufacturing articles when patterning different layers at the same time. The template is well suited for forming 3D memory arrays."

With:
--A template for imprint lithography is disclosed. The template can include a body with a base surface and a recession extending from the base surface. The recession can have steps and a feature. The steps can include a distal step that is farther from the base surface as compared to any other step, each step having a corresponding height. The feature can include the distal step with a rounded or tapered sidewall; a surface along a deepest part of the recession that is non-planar; or the height corresponding to the distal step being different from an average height corresponding to the remaining steps. The template can be used in an imprint lithography apparatus, manufacturing articles when patterning different layers at the same time, and 3D memory arrays.--

Signed and Sealed this  
Twenty-sixth Day of January, 2021

Drew Hirshfeld  
*Performing the Functions and Duties of the*  
*Under Secretary of Commerce for Intellectual Property and*  
*Director of the United States Patent and Trademark Office*